(12) United States Patent
Mysliwiec

(10) Patent No.: US 6,250,189 B1
(45) Date of Patent: *Jun. 26, 2001

(54) ROTARY DIE CUTTER

(75) Inventor: Stefan Alojzy Mysliwiec, Kaukauna, WI (US)

(73) Assignee: Kimberly-Clark Worldwide, Inc., Neenah, WI (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/470,357

(22) Filed: Dec. 22, 1999

Related U.S. Application Data

(63) Continuation-in-part of application No. 08/965,580, filed on Nov. 6, 1997, now Pat. No. 6,055,897, which is a continuation of application No. 08/667,570, filed on Jun. 21, 1996, now abandoned.

(51) Int. Cl.[7] .................................................. B26D 1/56
(52) U.S. Cl. .............................. 83/37; 83/698.41; 83/346; 83/669; 83/331
(58) Field of Search ............................ 83/698.41, 698.42, 83/346, 128, 331, 347, 698.51, 698.61, 698.21, 669, 123, 332, 333, 341, 659, 13, 23, 55, 27, 37; 76/107.8

(56) References Cited

U.S. PATENT DOCUMENTS

| | | | |
|---|---|---|---|
| Re. 17,892 | 12/1930 | Wood | 83/347 |
| 623,862 | 4/1899 | Armstrong | 83/128 |
| 1,044,931 * | 11/1912 | Simmons | 83/117 |
| 1,363,526 * | 12/1920 | Malm | 83/117 |
| 1,738,271 * | 12/1929 | Andrews | 493/354 |
| 2,113,843 * | 4/1938 | Kavle | 83/117 |
| 2,381,955 * | 8/1945 | Hoffman et al. | 164/28 |
| 2,525,987 * | 10/1950 | Willamson | 83/117 |
| 3,106,121 | 10/1963 | Novick | 83/152 |
| 3,170,358 * | 2/1965 | Martin | 83/673 |
| 3,488,778 * | 1/1970 | Goujon et al. | 2/224 |
| 3,508,458 * | 4/1970 | Cunningham | 83/9 |
| 3,526,163 * | 9/1970 | Lowery | 83/27 |

(List continued on next page.)

FOREIGN PATENT DOCUMENTS

| | | | |
|---|---|---|---|
| 546829 * | 4/1956 | (BE) | . |
| 402216 * | 9/1924 | (DE) | . |
| 1436912 * | 3/1969 | (DE) | . |
| 0297324 * | 1/1989 | (EP) | . |
| 0391299 * | 10/1990 | (EP) | . |
| 0525327 * | 2/1993 | (EP) | . |

(List continued on next page.)

*Primary Examiner*—Boyer Ashley
(74) *Attorney, Agent, or Firm*—Thomas J. Connelly; Thomas M. Parker; Douglas G. Glantz

(57) ABSTRACT

Novel apparatus and method are disclosed for cutting a sheet material by a rotary die cutter. A die shaft has an outer circumference and at least two die shaft bores having coaxial counterbores. The counterbores relieve stresses imposed by a die cutting insert. A knife formed about an outside periphery of the die cutting insert has a cutting edge and first and second side walls aligned at an angle of at least 15 degrees. The die cutting insert is removably attached at the inside periphery to the die shaft outer circumference. At least two threaded bolts sized to die cutting insert apertures secure the die cutting insert to the die shaft bores. Stresses are relieved in the internal metal of the die shaft as each insert is mounted, interchangeably and repeatedly, for cutting layered absorbent articles in large numbers and with multiple replacement of cutting die inserts without machining all of the die surfaces to keep the nip constant.

20 Claims, 2 Drawing Sheets

U.S. PATENT DOCUMENTS

| | | | |
|---|---|---|---|
| 3,552,244 | * 1/1971 | Smith, Jr. | 83/116 |
| 3,663,962 | * 5/1972 | Burger | 2/224 A |
| 3,744,384 | * 7/1973 | Jarriett et al. | 93/58.2 R |
| 3,792,637 | * 2/1974 | Saunders | 83/673 |
| 3,823,633 | 7/1974 | Ross | 83/346 |
| 3,881,490 | * 5/1975 | Whitehead et al. | 128/287 |
| 4,289,166 | * 9/1981 | Haines | 137/846 |
| 4,412,467 | 11/1983 | DeSanto | 83/346 |
| 4,499,802 | * 2/1985 | Simpson | 83/117 |
| 4,589,876 | * 5/1986 | Van Tilburg | 604/385 R |
| 4,670,960 | * 6/1987 | Provost | 29/415 |
| 4,862,574 | * 9/1989 | Seidy | 29/415 |
| 5,048,389 | * 9/1991 | Cook et al. | 162/109 |
| 5,086,683 | 2/1992 | Steidinger | 83/674 |
| 5,111,725 | * 5/1992 | Simpson et al. | 83/117 |
| 5,399,412 | * 3/1995 | Sudall et al. | 428/153 |
| 5,452,634 | * 9/1995 | Wilson | 83/89 |
| 5,826,475 | 10/1998 | Mysliwiec | 83/116 |
| 6,055,897 | * 5/2000 | Mysliwiec | 83/698.41 |

FOREIGN PATENT DOCUMENTS

| | | |
|---|---|---|
| 0670153 | * 9/1995 | (EP) . |
| 1420429 | * 9/1964 | (FR) . |
| 1572994 | * 7/1969 | (FR) . |
| 1442308 | * 7/1976 | (GB) . |
| 2024081 | * 1/1980 | (GB) . |
| 137666 | * 3/1960 | (SU) . |
| 9102622 | * 3/1991 | (WO) . |
| 9219451 | * 11/1992 | (WO) . |

\* cited by examiner

ROTARY DIE CUTTER

This application is a Continuation-in-Part of U.S. patent application Ser. No. 08/965,580, filed Nov. 6, 1997, now U.S. Pat. No. 6,055,897, which was a continuation of U.S. patent application Ser. No. 08/667,570, filed Jun. 21, 1996, now abandoned.

BACKGROUND OF THE INVENTION

1. Technical Field

This invention relates to a rotary die cutter. In one aspect, this invention relates to a die cutting insert for a rotary die cutter and to the die itself. In one aspect, this invention relates to a replaceable or interchangeable die cutting insert or combination replaceable and interchangeable die cutting insert for a rotary die used for cutting absorbent articles from a web of material.

2. Background

Rotary die cutters are used in different industries to cut different types of material. For example, rotary die cutters are used to cut paper, cardboard, plastic, laminates formed of two or more layers, absorbent materials such as wood pulp fluff, webs formed from natural or synthetic fibers, cellulose fluff, tissue, cotton, rayon, and various other types of woven and nonwoven materials.

A rotary die cutter includes a rotatable anvil roll cooperating with a rotatable knife shaft assembly. The knife shaft assembly has an outer circumference and at least one die cutter in the outer circumference of the knife shaft assembly. The knife shaft assembly cooperates with the anvil roll to form a nip through which a web of material can pass. As the web of material passes between the nip, the die cutter cuts the material into a predetermined shape.

INTRODUCTION TO THE INVENTION

Rotary die cutters employ a small nip dimension between the anvil roll and the knife shaft assembly of the rotary die cutter. Because the dimension of the nip between the anvil roll and the knife shaft assembly is very small, the anvil roll and the knife shaft assembly are manufactured to very close tolerances. Because of the close tolerances, most rotary die cutters utilize a solid die shaft having the die cutters integrally formed in the die shaft.

When replaceable die cutting inserts are mounted onto the circumference of a rotatable die shaft, it has been found that it becomes difficult to maintain the required close tolerances. Further, it is difficult to attach the die cutting inserts without also introducing additional forces which cause the inserts to flex under load.

Until now, to assure that the nip dimension remained constant, it was necessary to regrind the die cutting inserts after they were mounted on the knife shaft assembly to assure an accurate nip dimension. The regrinding was particularly necessary when two or more die cutting inserts were mounted about the outer periphery of a die shaft.

Rotary die cutters are used in cutting a plurality of layers of different material assembled to form an absorbent article such as a sanitary napkin or a pantiliner. The absorbent article products are constructed in layers, from top to bottom, of a liquid-permeable cover sheet, one or more absorbent layers, a liquid-impermeable baffle, a layer of garment attachment adhesive, and a removable peel strip. The various layers are bonded together by a construction adhesive, and the article has a total thickness of between about 0.1 inches (2.5 mm) to about 1.0 inch (2.5 cm).

It is an object of the present invention to provide a rotary die cutter apparatus and method providing a rotatable anvil and a rotatable knife shaft assembly with one or more replaceable die cutting inserts mounted to the outer circumference of a die shaft.

It is another object of the present invention to provide apparatus and method including a replaceable or interchangeable die cutting insert or combination replaceable and interchangeable die cutting insert for a rotary die used for cutting absorbent articles from a web of material.

It is yet another object of the present invention to provide a knife shaft assembly and method including a replaceable and/or interchangeable die cutting insert attached to the knife shaft assembly wherein the replaceable and/or interchangeable die cutting insert can be removed from the knife shaft assembly without requiring the inserts to be reground to obtain an accurate clearance nip between the anvil roll and the knife shaft assembly.

A further object of the present invention is to provide apparatus and method providing a replaceable and/or interchangeable die cutting insert which can be removed quickly and easily and/or attached to a die shaft.

Still another object of the present invention is to provide apparatus and method providing a replaceable and/or interchangeable die cutting insert which can be secured easily and properly to a die shaft at a predetermined torque value.

Still further, an object of the present invention is to provide a rotary die cutter apparatus and method providing a rotatable anvil roll mating with a rotatable knife shaft assembly to form a nip between the rotatable anvil roll and the rotatable knife shaft assembly and having one or more replaceable and/or interchangeable die cutting inserts mounted about an outer circumference of the knife shaft for cutting layered absorbent products in large numbers.

Other objects and advantages of the present invention will become more apparent in view of the following detailed description and the accompanying figures of the drawings.

SUMMARY OF THE INVENTION

The present invention provides novel apparatus and method for cutting an article from a sheet material using a rotary die cutter, including providing a die shaft having an outer circumference with at least two die shaft bores, each die shaft bore having a die shaft outer periphery counterbore coaxially formed in the die shaft and respectfully aligned with the die shaft bores. The die shaft outer periphery counterbores are located at the outer circumference of the die shaft. The die shaft outer periphery counterbores relieve stresses in the die shaft imposed by a die cutting insert mounted to the die shaft.

The die cutting insert has an outside periphery, an inside periphery, and first and second spaced apart ends. A knife formed about the outside periphery has a cutting edge and first and second side walls aligned at an angle of at least 15 degrees relative to one another. The die cutting insert is removably attached at the inside periphery to the outer circumference of the die shaft. At least one die cutting insert aperture is formed adjacent to each of the first and second ends and extends completely through the die cutting insert. At least two threaded bolts are sized to mate with the die cutting insert apertures and to secure the die cutting insert to the die shaft bores formed in the die shaft.

The apparatus and method of the present invention preferably include a specified die shaft counterbore depth and structure.

The die shaft counterbores formed on the outer circumference of a rotary die cutter's die shaft and aligned with each die shaft bore formed in the die shaft empirically have been found to relieve stresses in the internal metal of the die shaft as each insert is mounted, interchangeably and repeatedly, to the die shaft in the process of cutting large numbers of layered absorbent articles.

The rotary die cutter apparatus and method of the present invention provide solution for difficulties associated with multiple replacement of cutting die inserts on a die shaft without the need for machining all of the die surfaces to keep the nip constant.

DETAILED DESCRIPTION

In accordance with the present invention, novel apparatus and method have been developed for providing a replaceable or interchangeable die cutting insert or combination replaceable and interchangeable die cutting insert for a rotary die used for cutting layered absorbent articles from a web of material. The novel apparatus and method include means and method for providing a cutting insert having a unique configuration and means and method for mounting the unique cutting insert properly to the outer circumference of a knife shaft assembly.

The apparatus and method of the present invention include means and method for providing a replaceable and/or interchangeable die cutting insert for a rotary die cutter and the die itself. The insert includes an arcuately shaped base formed on a predetermined radius.

The base has first and second spaced apart ends and first and second oppositely aligned surfaces. A continuous knife is integrally formed integrally about the outer periphery of the first surface. The knife has a cutting edge and first and second side walls. The knife edge has a thickness of less than about 0.005 inches (0.127 mm), and the first side wall is aligned approximately perpendicular to the cutting edge. The second side wall is aligned at an angle of at least about 15° relative to the cutting edge.

The present invention also includes means and method for providing a die cutting insert mechanism for removably attaching the die cutting insert to a die cutting shaft. The die cutting insert attachment mechanism includes at least one aperture formed adjacent to each end of the die cutting insert base. The apertures extend completely through the die cutting insert base and receive threaded bolts. The threaded bolts are sized to mate with the apertures and to secure the die cutting insert base to the die cutting shaft.

Figure 1:
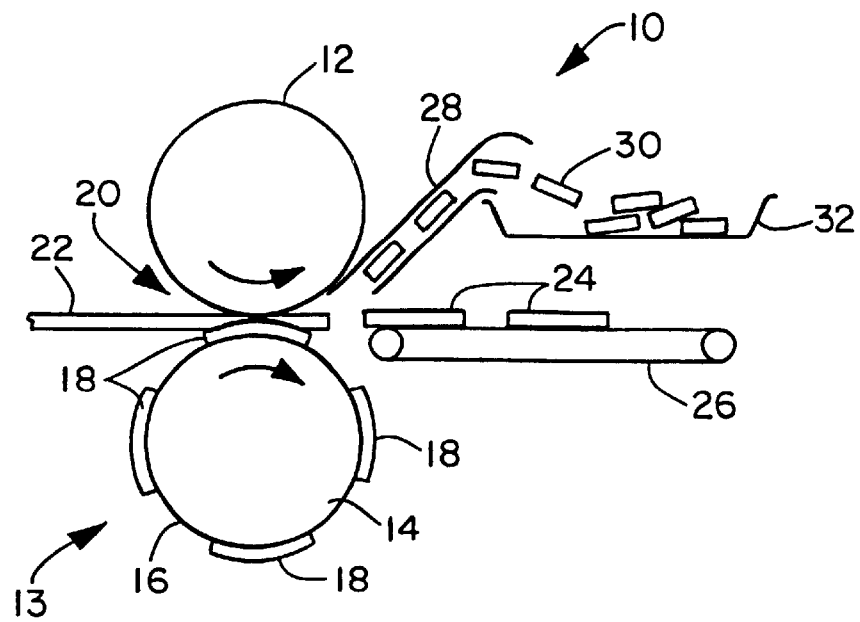
FIG. 1 is a schematic view of a rotary die cutter showing a rotatable anvil roll cooperating with a rotatable knife shaft assembly to form a nip between the anvil roll and the knife shaft assembly and having a web of material passing through the nip.

Referring now to FIG. 1, a rotary die cutter 10 is shown including a rotatable anvil roll 12 cooperating with a rotatable knife shaft assembly 13. The anvil roll 12 is constructed of a ferrous or non-ferrous metal and has a smooth surface. The anvil roll 12 is formed from a compressible material such as neoprene rubber or from a non-compressible material such as steel. It is preferred that the anvil roll 12 be a metal roll.

The knife shaft assembly 13 includes a die shaft 14 having an outer circumference 16 and at least one replaceable and/or interchangeable die cutting insert 18 mounted onto the die shaft 14. By replaceable is meant that the insert 18 can be unbolted and removed from the die shaft 14, cleaned, reground, or machined and then secured back onto the die shaft 14 in its original position. By interchangeable, it is meant that each of the die inserts 18 is capable of being mutually interchanged with any other insert 18. By replaceable and/or interchangeable is meant replaceable, interchangeable, or a combination of replaceable and interchangeable. The replaceability and/or interchangeability feature is important because it is preferred and, until now, difficult to produce replaceable and interchangeable inserts 18 for a rotary die cutter 10 while still maintaining the nip dimension between the anvil roll 12 and the knife shaft assembly 13.

The knife shaft assembly 13 is constructed of a metal, e.g., steel, and has an outer circumference machined to a very close tolerance. The die shaft 14 has one or more, preferably several, die cutting inserts 18 mounted to its outer circumference 16. As depicted in FIG. 1, four die cutting inserts 18 are equally spaced about the outer circumference 16 of the die shaft 14. The anvil roll 12 and the knife shaft assembly 13 cooperate to form a nip 20 between the anvil roll 12 and the knife shaft assembly 13 through which a web of material 22 is pass. As the anvil roll 12 and the knife shaft assembly 13 rotate in opposite directions, the web of material 22 passes through the nip 20 and is cut by the die cutting inserts 18 into individual articles 24. The articles 24 are transported by conventional means, such as a conveyor 26, to a location where the individual articles 24 are stacked, packaged, and later shipped. Any waste trim 30 from the rotary die cutter 10 is directed away from the nip 20 by a conduit 28 using vacuum, air pressure, gravity, or mechanical means. The waste trim 30 then is collected in a hopper 32 for recycling or some other means of disposal.

Figure 2:
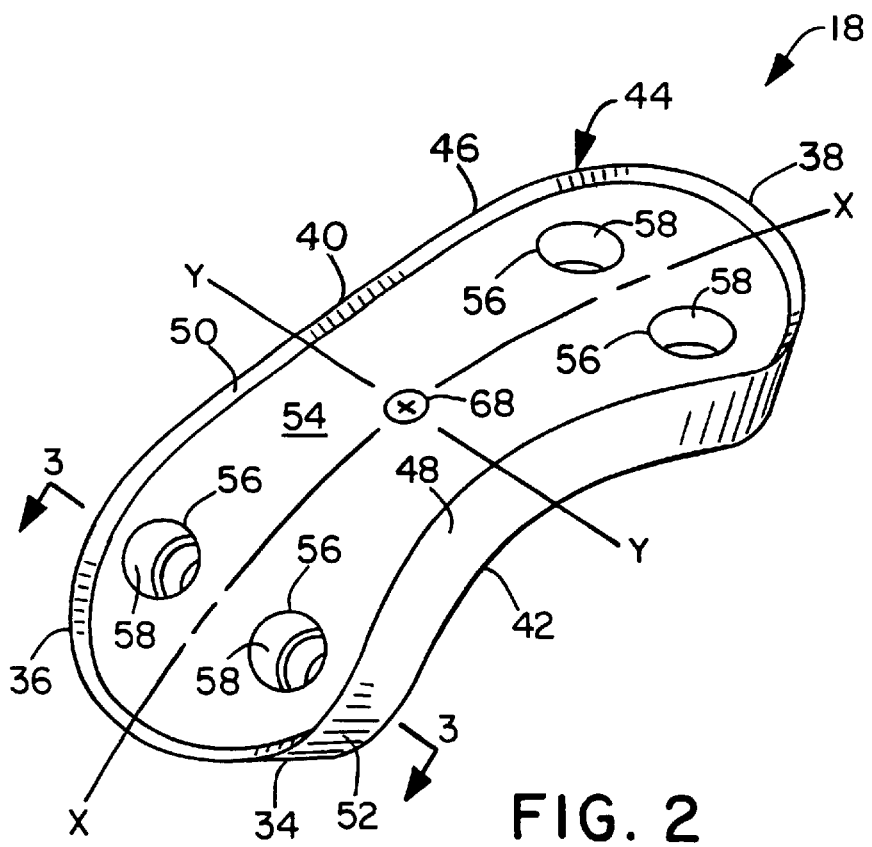
FIG. 2 is a perspective view of a replaceable and/or interchangeable die cutting insert in accordance with the present invention.

Referring now to FIG. 2, a replaceable and/or interchangeable die cutting insert 18 is shown before it is secured to the die shaft 14. The replaceable and/or interchangeable die cutting insert 18 has an arcuately shaped base 34 formed on a predetermined radius. The base 34 has first and second spaced apart ends 36 and 38, respectively, and first and second oppositely aligned surfaces 40 and 42, respectively. The first surface 40 faces the anvil roll 12 when the inserts 18 are assembled onto the knife shaft assembly 13. The second surface 42 is concave to match the outer circumference 16 of the die shaft 14 onto which the insert 18 is to be secured. The second surface 42 is machined to have a tolerance of plus or minus 0.0001 inches (0.0025 mm) to facilitate a proper attachment between the die cutting insert 18 and the die shaft 14. If the second surface 42 is not machined to match the outer circumference 16 of the die shaft 14 closely, then additional compressive forces develop as each insert 18 is secured to the die shaft 14. The compressive forces alter the dimension of the nip 20, which is not preferred.

Figure 3:
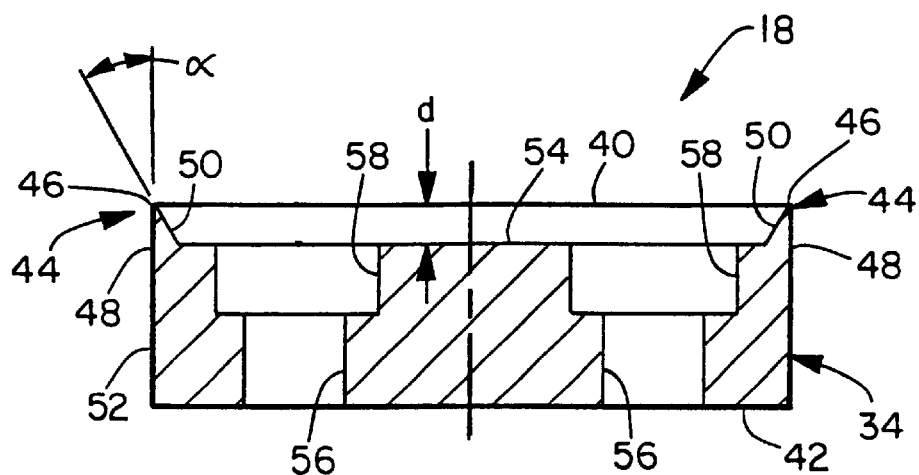
FIG. 3 is a cross-sectional view taken along line 3—3 of FIG. 2 showing the cutting edges and the mounting holes for attaching the insert to a die shaft in accordance with the present invention.

Referring now to FIGS. 2 and 3, the die cutting insert 18 is shown having a knife 44 integrally formed about the periphery of the first surface 40. Preferably, the knife 44 is a continuous element but could be serrated if preferred. The knife 44 has a cutting edge 46 and first and second side walls 48 and 50, respectively. The cutting edge 46 has a width of less than about 0.005 inches (0.127 mm). Preferably, the width of the cutting edge 46 is between about 0.0005 inches to about 0.004 inches (0.127 mm–1.016 mm), and most preferably, the width is between about 0.001 inches to about 0.002 inches (0.025 mm to 0.051 mm). The width of the cutting edge 46 is very important because if the thickness becomes too great, it is difficult to cut cleanly the material 22 passing through the nip 20. Rather than making a clean cut, the cutting edge 46 compresses the material 22 and allows the material 22 to be torn or broken, thereby producing a ragged cut.

As shown in FIG. 3, the first side wall 48 is aligned approximately perpendicular to the cutting edge 46. The first side wall 48 is aligned coextensively with the outside periphery 52 of the base 34. Preferably, the first side wall 48 is aligned perpendicular, i.e., at an angle of about 90 degrees, to the cutting edge 46. The second side wall 50 is aligned in an angle of at least about 15° relative to the cutting edge 46.

The second side wall 50 is located inwardly of the first side wall 48 and terminates at a third surface 54. The third surface 54 is located intermediate to the first surface 40 and the second surface 42. The third surface 54 is spaced below the first surface 40 by a distance "d." The actual distance between the first surface 40 and the third surface 54 can vary but is about equal to the thickness of the article 24 to be cut. When cutting a compressible article having a total thickness of about 0.125 inches (3.175 mm), the distance of the third surface 54 below the first surface 40 is between about 0.1 inches (2.54 mm) to about 0.125 inches (3.175 mm). The distance "d" also represents the height of the knife 44. The distance "d" is affected by the type of material 22 being cut, the thickness of the material, whether the material is compressible, whether the material is formed from a single layer or from a plurality of layers, whether the layers are bonded together by an adhesive, as well as the particular characteristics of the material itself. A thermoplastic film to be cut reacts differently from a fibrous nonwoven web. When cutting thinner materials, the distance "d" is less than the thickness of the material 22 because the cut does not to extend as far through the material as with a thicker product. When cutting the material 22, it is not necessary that the cutting edge 46 actually contact the anvil roll 12. In fact, the life of the cutting die insert 18 is extended when the cutting edge 46 does not physically contact the anvil roll 12.

The second side wall 50 is aligned at an angle α of at least about 15° relative to the cutting edge 46. Preferably, the angle α is between about 15° to about 50° relative to the cutting edge 46, and more preferably, the angle α is between about 15° to about 40° relative to the cutting edge 46. It is important that the second side wall 50 is angled relative to the cutting edge 46 at an angle α of at least about 15° because the dimensions of the insert 18 provide only just the right amount of support for the knife 44. Since the first side wall 48 is approximately perpendicularly aligned to the cutting edge 46, all support provided to the knife 44 comes from the material present between the first side wall 48 and the second side wall 50. If the angle α is less than about 15°, cutting edge 46 will crack or chip as the material 22 is cut because the forces acting on the cutting edge 46 become very high.

Figure 4:
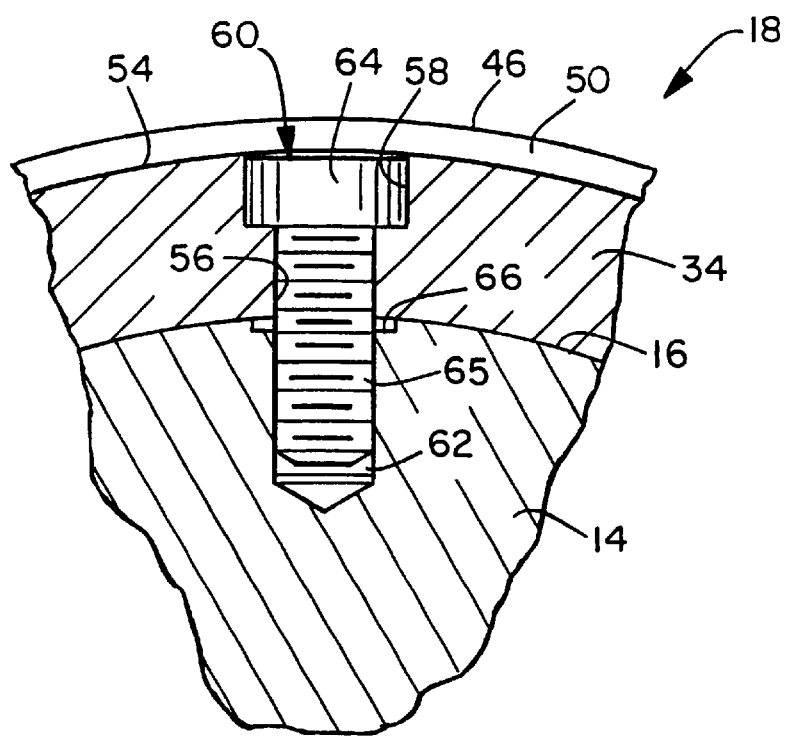
FIG. 4 is an exploded, cross-sectional view of a portion of the replaceable and/or interchangeable die cutting insert mounted to a portion of the outer circumference of the die shaft in accordance with the present invention.

Referring now to FIGS. 3 and 4, the replaceable and/or interchangeable die cutting insert 18 further includes means and method for removably attaching the base 34 to at least a portion of the outer circumference 16 of the die shaft 14. It should be noted that the die shaft 14 can have one or more, and preferably a plurality, of replaceable and/or interchangeable die cutting inserts 18 mounted about its outer circumference 16. The inserts 18 are arranged so that they are equally spaced apart from one another, or the inserts 18 are arranged such that the outer periphery of one insert 18 contacts the outer periphery of an adjacent insert 18. In one aspect, the inserts 18 are mounted on the outer circumference 16 of the die shaft 14 such that the inserts 18 are grouped around a portion of the outer circumference 16 while another portion of the outer circumference 16 is void of any inserts. The particular arrangement and the spacing of the inserts 18 depend on the type of material to be cut and the particular configuration of the articles to be cut.

In one aspect, the means for removably attaching the die cutting inserts 18 to the die shaft 14 include forming at least one aperture 56 adjacent to each of the first and second ends 36 and 38, respectively. Preferably, a pair of apertures 56 are formed adjacent to each of the ends, 36 and 38, respectively, so as to permit each insert 18 to be secured correctly to the die shaft 14 without introducing unwanted forces into each insert 18. Each of the apertures 56 extends completely through the base 34 from the third surface 54 to the second surface 42. The apertures 56 are not threaded but contain a counterbore 58 located adjacent to the third surface 54. Each counterbore 58 is sized and configured to receive the head of a machine bolt 60, a la FIG. 4, which will attach the insert 18 to the die shaft 14.

Referring now to FIG. 4, a threaded machine bolt 60 is shown positioned in one of the apertures 56. The bolt 60 is aligned with and threaded into a threaded bore or aperture 62 formed in the die shaft 14. The bolt 60 contains a head 64 and a threaded shank 65. The head 64 is larger than the threaded shank 65 and seats in the counterbore 58 when the insert 18 is mounted onto the die shaft 14. When assembled, the head 64 is flush with the third surface 54. Each of the machine bolts 60 have a predetermined thread pitch. The length of the threads and the number of threads per inch vary depending the application. The size and style of the bolts 60 are selected depending on the size and configuration of the replaceable and/or interchangeable die cutting insert 18.

Bolts 60 are tightened to a relatively high torque setting, e.g., between about 100 pounds per square inch (psi) to about 1000 psi. Preferably, each bolt 60 is tightened to a torque setting of between about 200 psi to about 500 psi and, more preferably, between about 400 psi to about 500 psi. To facilitate the torqueing of the bolts 60, a fine thread is used instead of a coarse thread. A preferred bolt size for bolt 60 for mounting an insert measuring about six inches in length to a die shaft 14 is a bolt about two inches (5 cm) in width, about 0.75 inches (1.9 cm) in depth, and thread of 0.3125-24 UAF. It is preferred to drill and tap the threaded bore 62 to a depth greater than the threaded length of the bolt shank 65 so that the bolt 60 will not bottom out in the threaded bore 62. This difference in length allows the bolt 60 to be properly torqued during assembly.

To secure the replaceable and/or interchangeable die cutting inserts 18 properly to the die shaft 14, the bolts 60 are sized and configured to mate with each pair of the coaxially aligned apertures 56 and 62. When each of the die cutting inserts 18 contains a single aperture 56 formed adjacent to each end 36 and 38, respectively, only two threaded bolts 60 are required to secure each insert 18 to the die shaft 14. However, when each of the die cutting inserts 18 contains two apertures 56 formed adjacent to each end 36 and 38, respectively, four threaded bolts 60 are required to secure each insert 18 to the die shaft 14.

Referring again to FIG. 4, one of the threaded bores 62 is shown. A plurality of threaded bores 62 are provided, one for each of the corresponding apertures 56 formed in each of the inserts 18. In one aspect, the threaded bores 62 in the die shaft 14 are arranged such that various sizes of inserts 18 are assembled onto the die shaft 14 at a later time. By forming more threaded bores 16 than needed and arranging them at different locations about the outer circumference 16 of the die shaft 14, a single die shaft 14 accommodates two or more different styles of die cutting inserts 18.

It has been found to be preferred to form a counterbore 66 at the open end of each of the threaded bores 62. Each counterbore 66 begins at the outer circumference 16 of the die shaft 14 and has a depth of at least about 0.05 inches (0.127 mm). Preferably, the depth will range from about 0.1 inches to about 0.2 inches (2.5 mm to 5.1 mm) and, more preferably, the depth will range between about 0.1 inches and about 0.15 inches (2.5 mm to 3.8 mm). A depth of about 0.125 inches (3.175 mm) works well when the threaded bores 62 have a diameter of about 0.3125 inches (7.938 mm) or greater.

The presence of the counterbores 66 are important for they function to relieve compressive stresses in the metal from which the die shaft 14 is constructed. Such forces occur as the replaceable and/or interchangeable die cutting inserts 18 are secured to the die shaft 14. It has been found that as a machine bolt 60 is threaded into the threaded bore 62 and then torqued to a relatively high inch-pound value, the metal forming the die shaft 14 on a microscopic scale actually buckles or deforms as the die shaft 14 is drawn up against the insert 18. By forming the counterbore 66 at the open end of the threaded bore 62, the compressive stresses and forces are reduced.

Referring again to FIG. 2, the insert 18 contains a pin hole 68 formed at the intersection of the central longitudinal axis X—X and the central transverse axis Y—Y. The pin hole 68 is coaxially aligned with a hole or bore formed in the die shaft 14 such that a pin inserted through the pin hole 68 serves to align physically the insert 18 onto the die shaft 14. When the insert is aligned and held in position by a pin (not shown), the bolts 60 are threaded into the threaded bores 62. It should be noted that the pin hole 68 is an optional feature and is present only for convenience in mounting the insert 18 onto the die shaft 14.

In accordance with the apparatus and method of the present invention, die shaft counterbores are formed on the outer circumference of a rotary die cutter's die shaft, which die shaft counterbores are aligned with each die shaft bore formed in the die shaft. The die shaft counterbores empirically have been found to function to relieve stresses in the internal metal of the die shaft as each insert is mounted, interchangeably and repeatedly, to the die shaft when cutting layered absorbent products in large numbers.

The rotary die cutter apparatus and method of the present invention, incorporating the formation of a die shaft counterbore on the outer circumference of the die shaft, provide a solution for difficulties associated with multiple replacement of cutting die inserts on a die shaft without the need for machining all of the die surfaces to keep the nip constant. The rotary die cutter apparatus and method of the present invention provide for inserts mounted onto the die shaft while stresses are relieved by the die shaft counterbores. Using a rotary die cutter without the die shaft counterbores in accordance with the apparatus and method of the present invention requires machining all of the die inserts so that the height above the die shaft remains constant. The apparatus and method of the present invention provide for the die insert to be removed and replaced, interchangeably and repeatedly, by another insert without the need to re-machine all of the die inserts mounted on the die shaft.

It has been found empirically that the rotary die cutter in accordance with the apparatus and method of the present invention preferably has a specified die shaft counterbore depth and structure. It has have been found that the specified die shaft counterbore depth and structure are important for relieving stresses and prolonging the life of the rotary die cutter using replaceable rotary die cutting inserts in accordance with the apparatus and method of the present invention.

While the invention has been described in conjunction with several specific embodiments, it is to be understood that many alternatives, modifications, and variations will be apparent in light of the foregoing detailed description together with the figures of the drawings. Accordingly, this invention is intended to embrace all such alternatives, modifications, and variations which fall within the spirit and scope of the appended claims.

What is claimed is:

1. A method of cutting an article from a sheet material using a rotary die cutter, comprising:

a) providing a die shaft having an outer circumference with at least two die shaft bores, each of said die shaft bores having a die shaft outer periphery counterbore coaxially formed in said die shaft and respectfully aligned with said die shaft bores, wherein said die shaft outer periphery counterbores are located at said outer circumference of said die shaft and wherein said die shaft outer periphery counterbores relieve stresses in said die shaft imposed by a die cutting insert mounted to said die shaft;

b) providing a die cutting insert having a die cutting insert outside periphery and a die cutting insert inside periphery, said die cutting insert having first and second spaced apart ends;

c) providing a knife formed about the outside periphery of said die cutting insert, said knife having a cutting edge and first and second side walls with said first and second sidewalls being aligned at an angle of at least 15 degrees relative to one another; and d) removably attaching said die cutting insert at said die cutting insert inside periphery to said die shaft at said outer circumference of said die shaft, wherein at least one die cutting insert aperture is formed adjacent to each of said first and second ends and extending completely through said die cutting insert, and wherein at least two threaded bolts are sized to mate with said die cutting insert apertures and secure said die cutting insert to said die shaft bores formed in said die shaft.

2. A method of cutting an article from a sheet material using a rotary die cutter as set forth in claim 1, wherein said first sidewall is coextensive with said outside periphery of said die cutting insert.

3. A method of cutting an article from a sheet material using a rotary die cutter as set forth in claim 1, wherein said second sidewall is located inwardly of said first sidewall.

4. A method of cutting an article from a sheet material using a rotary die cutter as set forth in claim 1, wherein said second sidewall terminates into a third surface.

5. A method of cutting an article from a sheet material using a rotary die cutter as set forth in claim 4, wherein said third surface is spaced at least 0.127 mm below said die cutting insert outside periphery.

6. A method of cutting an article from a sheet material using a rotary die cutter as set forth in claim 1, wherein said first and second sidewalls are aligned at an angle of between about 15 degrees to about 50 degrees relative to one another.

7. A method of cutting an article from a sheet material using a rotary die cutter as set forth in claim 6, wherein said first and second sidewalls are aligned at an angle of between about 15 degrees to about 40 degrees relative to one another.

8. A method of cutting an article from a sheet material using a rotary die cutter as set forth in claim 7, wherein each of said die shaft counterbores has a depth of from about 2.5 mm to about 5.0 mm.

9. A method of cutting an article from a sheet material using a rotary die cutter as set forth in claim 8, wherein each of said die shaft counterbores has a depth of about 3.175 mm.

10. A method of cutting an article from a sheet material using a rotary die cutter, comprising:
  a) providing a die shaft having an outer circumference with at least four die shaft bores, each of said die shaft bores having a die shaft outer periphery counterbore coaxially formed in said die shaft and respectfully aligned with said die shaft bores, wherein said die shaft outer periphery counterbores are located at said outer circumference of said die shaft and wherein said die shaft outer periphery counterbores relieve stresses in said die shaft imposed by a die cutting insert mounted to said die shaft;
  b) providing an arcuately shaped die cutting insert having a die cutting insert outside periphery and a die cutting insert inside periphery, said die cutting insert having first and second spaced apart ends;
  c) providing a continuous knife integrally formed about the outside periphery of said die cutting insert, said knife having a cutting edge and first and second side walls with said first and second sidewalls being aligned at an angle of at least 15 degrees relative to one another; and
  d) removably attaching said die cutting insert at said die cutting insert inside periphery to at least a portion of the outer circumference of said die shaft, wherein a pair of die cutting insert apertures are formed adjacent to each of said first and second ends, all of said die cutting insert apertures extending completely through said die cutting insert; and wherein four threaded bolts are sized to mate with said die cutting insert apertures and secure said die cutting insert to said die shaft bores formed in said die shaft.

11. A method of cutting an article from a sheet material using a rotary die cutter as set forth in claim 10, wherein said first sidewall is coextensive with said outside periphery of said die cutting insert.

12. A method of cutting an article from a sheet material using a rotary die cutter as set forth in claim 10, wherein said second sidewall is located inward of said first sidewall.

13. A method of cutting an article from a sheet material using a rotary die cutter as set forth in claim 10, wherein said die cutting insert has a third surface and said second sidewall terminates at said third surface.

14. A method of cutting an article from a sheet material using a rotary die cutter as set forth in claim 13, wherein said die cutting insert has a second surface and said apertures extend from said third surface to said second surface.

15. A method of cutting an article from a sheet material using a rotary die cutter comprising:
  a) providing a rotatable anvil roll; and
  b) providing a rotatable die shaft having an outer circumference with at least two threaded die shaft bores, each of said threaded die shaft bores having a die shaft outer periphery counterbore coaxially formed in said die shaft and aligned with said threaded die shaft bores, wherein said die shaft outer periphery counterbores are located at said outer circumference of said die shaft and wherein said die shaft outer periphery counterbores relieve stresses in said die shaft imposed by a die cutting insert mounted to said die shaft, said die shaft having at least one replaceable die cutting insert mounted thereto, each of said die cutting inserts cooperating with said anvil roll to form a nip between said anvil roll and said die cutting insert, each of said die cutting inserts having an arcuately shaped base, said base having first and second spaced apart ends, a continuous knife integrally formed about the periphery of said base, said knife having a cutting edge and first and second side walls with said first and second sidewalls being aligned at an angle of at least 15 degrees relative to one another, and removably attaching said base to said die shaft, wherein at least one die cutting insert non-threaded aperture is formed adjacent to each of said first and second ends, said die cutting insert non-threaded apertures extending completely through said base, and wherein at least two threaded bolts are sized to mate with said die cutting insert non-threaded apertures and secure said die cutting insert to said die shaft bores formed in said die shaft.

16. A method of cutting an article from a sheet material using a rotary die cutter as set forth in claim 15, wherein each of said die shaft counterbores has a depth of at least 1.27 mm.

17. A method of cutting an article from a sheet material using a rotary die cutter as set forth in claim 15, wherein each of said die shaft counterbores has a depth of from about 2.5 mm to about 5.0 mm.

18. A method of cutting an article from a sheet material using a rotary die cutter as set forth in claim 17, wherein each of said die shaft counterbores has a depth of about 3.175 mm.

19. A method of cutting an article from a sheet material using a rotary die cutter as set forth in claim 15, wherein said rotatable die shaft with said outer circumference includes at least four die shaft bores, each of said at least four die shaft bores having a die shaft outer periphery counterbore coaxially formed with said at least four die shaft bores, wherein said die shaft outer periphery counterbore having a depth of from about 2.5 mm to about 5.0 mm is located at said outer circumference of said die shaft and wherein said die shaft outer periphery counterbores relieve stresses in said die shaft imposed by a die cutting insert mounted to said die shaft.

20. A method of cutting an article from a sheet material using a rotary die cutter as set forth in claim 19, wherein said die shaft has at least one replaceable die cutting insert mounted to said die shaft, each of said die cutting inserts cooperating with said anvil roll to form a nip between said anvil roll and said die cutting insert, each of said die cutting inserts having an arcuately shaped base, said base having first and second spaced apart ends, a continuous knife integrally formed about the periphery of said base, said knife having a cutting edge and first and second side walls with said first and second sidewalls being aligned at an angle of at least about 15 degrees relative to one another, and removably attaching said base to at least a portion of the outer circumference of said die shaft, said wherein a pair of die cutting insert apertures are formed adjacent to each of said first and second ends, all of said die cutting insert apertures extending completely through said base, and wherein four threaded bolts are sized to mate with said die cutting insert apertures and secure said die cutting insert to said die shaft bores formed in said die shaft.

\* \* \* \* \*